(12) United States Patent
Wiesner et al.

(10) Patent No.: US 8,112,683 B1
(45) Date of Patent: Feb. 7, 2012

(54) SYSTEM AND APPLICATION DEBUGGING

(75) Inventors: Robert Wiesner, Chandler, AZ (US); Guido Kehrle, Chandler, AZ (US)

(73) Assignee: Marvell International Ltd., Hamilton (BM)

( * ) Notice: Subject to any disclaimer, the term of this patent is extended or adjusted under 35 U.S.C. 154(b) by 359 days.

(21) Appl. No.: 12/025,600

(22) Filed: Feb. 4, 2008

Related U.S. Application Data

(60) Provisional application No. 60/888,397, filed on Feb. 6, 2007.

(51) Int. Cl.
*G01R 31/28* (2006.01)

(52) U.S. Cl. ...................................................... 714/727

(58) Field of Classification Search ........................ None
See application file for complete search history.

(56) References Cited

U.S. PATENT DOCUMENTS

| | | | |
|---|---|---|---|
| 6,205,560 B1 * | 3/2001 | Hervin et al. ................... 714/34 |
| 6,732,311 B1 * | 5/2004 | Fischer et al. ................. 714/737 |
| 7,216,276 B1 | 5/2007 | Azimi et al. | |
| 7,533,315 B2 * | 5/2009 | Han et al. ...................... 714/733 |
| 7,590,911 B1 * | 9/2009 | Azimi et al. ................... 714/733 |
| 2002/0065646 A1 * | 5/2002 | Waldie et al. ................... 703/26 |
| 2005/0216802 A1 * | 9/2005 | Warren ......................... 714/724 |
| 2007/0061646 A1 * | 3/2007 | Whetsel ........................ 714/726 |
| 2007/0168803 A1 * | 7/2007 | Wang et al. ................... 714/726 |
| 2009/0265594 A1 * | 10/2009 | Whetsel ........................ 714/727 |

* cited by examiner

*Primary Examiner* — Jeffrey A Gaffin
*Assistant Examiner* — Guerrier Merant

(57) ABSTRACT

Systems, apparatuses, and methods for system and application debugging are described herein. A tested platform may include a debug event monitor in a boundary scan interface that detects a debug event in a process and determines a characteristic associated with the debug event. The debug event monitor may trigger an application debug event or a boundary scan debug event based at least in part on the determined characteristic. Other embodiments may be described and claimed.

20 Claims, 4 Drawing Sheets

SYSTEM AND APPLICATION DEBUGGING

CROSS-REFERENCES TO RELATED APPLICATIONS

This present application claims the benefit under 35 U.S.C. §119(e) of provisional application 60/888,397, filed on Feb. 6, 2007. The specification of said provisional application is hereby incorporated in its entirety, except for those sections, if any, that are inconsistent with this specification.

TECHNICAL FIELD

Embodiments of the present invention generally relate to the field of testing systems and devices and, in particular, to an arrangement for system and application debugging.

BACKGROUND

Microelectronic systems, e.g., integrated circuits, circuit boards, etc., are often designed with built-in testing hardware to provide access to an external testing platform. The external testing platform may communicate with a microelectronic system, e.g., a tested platform, via a boundary scan testing process that provides an interface at the tested platform's boundary. Boundary scan testing may allow the testing platform to access and test the various portions of the tested platform (e.g., interconnects on circuit board, sub-blocks within an integrated circuit, etc.). The Institute of Electrical and Electronics Engineers (IEEE) has standardized a boundary scan procedure in IEEE 1149.1—1990. IEEE 1149.1-1990 is often referred to as Joint Test Action Group (JTAG), which is the body promulgating the standard. Reference to a JTAG component (e.g., debugger, interface, etc.), may refer to a component that is compatible with this standard.

Boundary scan testing may often be used for system debugging in an embedded platform. System debugging provides service-level debugging of drivers, an operating system (OS) kernel, etc. For system debugging, a tested platform's OS is treated as a large application running on a specific core of the tested platform. The OS may include a number of debug events put in place for debugging purposes that serve as an intentional stopping or pausing place in the program. When an OS debug event occurs, a debugger (e.g., a JTAG debugger) running on a testing platform may debug the OS by stopping the OS and resuming it through JTAG commands.

Embedded platforms may also be tested through application debugging. Application debugging may be used by a platform developer to debug a specific application running on a tested platform. The developer may use a debug manager that is provided by an OS of the tested platform. Unlike the JTAG debugger, the OS is always running through the application debugging.

In traditional systems, system and application debugging are done separately from one another due to the fact that if a debug event occurs within an application of the execution environment, a JTAG debugger will catch the event first. However, the JTAG debugger may not be able to determine which application is active, thereby comprising the ability of application debugging to be done while the JTAG debugger is operational.

SUMMARY

In some embodiments a platform is described having a processing block configured to execute a plurality of processes; and a boundary scan interface having a debug event monitor configured to detect a debug event within a first process of the plurality of processes, to determine a characteristic associated with the debug event, and to trigger either a boundary scan debug event or an application debug event based at least in part on the determined characteristic. The determined characteristic may be based at least in part on a memory address related to the debug event by using the address in an operation with a bitmask.

In some embodiments the determined characteristic may be based at least in part on an execution mode of the processing block when the debug event is detected.

The platform may be a system-on-a-chip.

In some embodiments, the plurality of processes may include a service process and an application process.

If the determined characteristic establishes that the first process is the application process, the debug event monitor may trigger the application debug event and an application debugger of the plurality of processes may be configured to receive the application debug event and debug the application process.

In some embodiments the determined characteristic establishes that the first process is the service process and the debug event monitor is further configured to trigger the boundary scan debug event.

The debug event monitor may comprise debug event monitor circuitry.

In some embodiment the boundary scan interface comprises a Joint Test Action Group (JTAG) interface.

In some embodiments, a method of debugging is described that includes executing a plurality of processes; detecting a debug event within a first process of the plurality of processes; determining a characteristic associated with the debug event; and triggering either a boundary scan debug event or an application debug event based at least in part on the determined characteristic.

Determining the characteristic may comprise determining a memory address related to the debug event and determining the characteristic based on a bitmask and the memory address.

Determining the characteristic may comprise determining an execution mode of a processing block executing the first process when the debug event is detected.

If it is determined that the first process is a service process, the method may include triggering the boundary scan debug event and passing the boundary scan debug event to an external boundary scan debugger.

If it is determined that the first process is an application process, the method may include triggering the application debug event.

In some embodiments a debugging system is described including a tested platform having a processing block configured to execute a plurality of processes, and a boundary scan interface having a debug event monitor configured to detect a debug event within a first process of the plurality of processes, to determine a characteristic associated with the debug event, and to trigger either a boundary scan debug event or an application debug event based at least in part on the determined characteristic; and a testing platform having a boundary scan debugger operatively coupled to the plurality of processes through the boundary scan interface.

The debug event monitor may be configured to trigger the boundary scan debug event and pass the boundary scan debug event to the boundary scan debugger.

The determined characteristic may be based at least in part on a memory address related to the debug event and/or an execution mode of the processing block when the debug event is detected.

The boundary scan debugger may comprise a Joint Test Action Group (JTAG) debugger.

The plurality of processes may include a service process and an application process.

Other features that are considered as characteristic for embodiments of the present invention are set forth in the appended claims.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Reference in the specification to "one embodiment" or "an embodiment" means that a particular feature, structure, or characteristic described in connection with the embodiment is included in at least one embodiment. The appearances of the phrase "in one embodiment" in various places in the specification do not necessarily all refer to the same embodiment, but they may.

The phrase "A/B" and "A and/or B" means (A), (B), or (A and B). The phrase "A, B, and/or C" means (A), (B), (C), (A and B), (A and C), (B and C) or (A, B and C). The phrase "(A) B" means (A and B) or (B), that is, A is optional.

Figure 1:
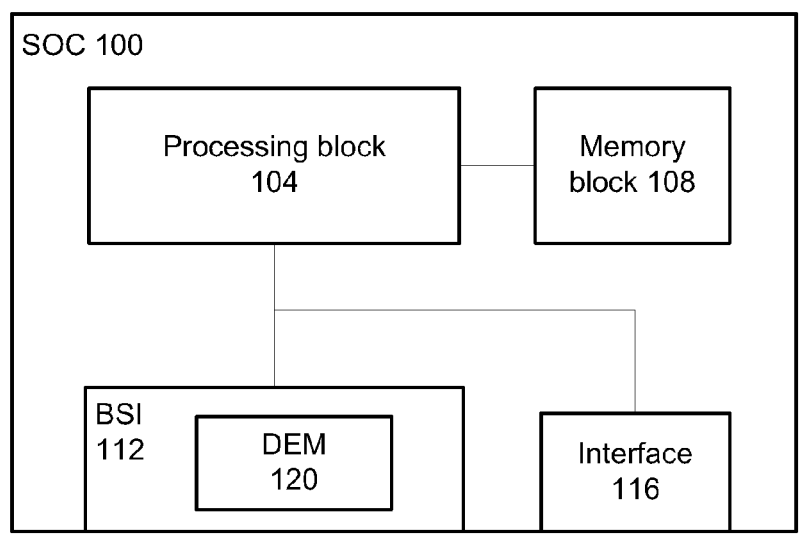
FIG. 1 is a schematic of a system-on-a-chip (SOC) in accordance with various embodiments of the present invention.

FIG. 1 is a schematic of a system-on-a-chip (SOC) 100 in accordance with an embodiment of the present invention. The SOC 100 may include a processing block 104 and memory block 108 coupled to one another as shown. The processing block 104 may also be coupled to a boundary scan interface (BSI) 112 and another interface 116. The processing block 104 may be operatively coupled to one or more external debugging processes through one or more of these interfaces.

Figure 2:
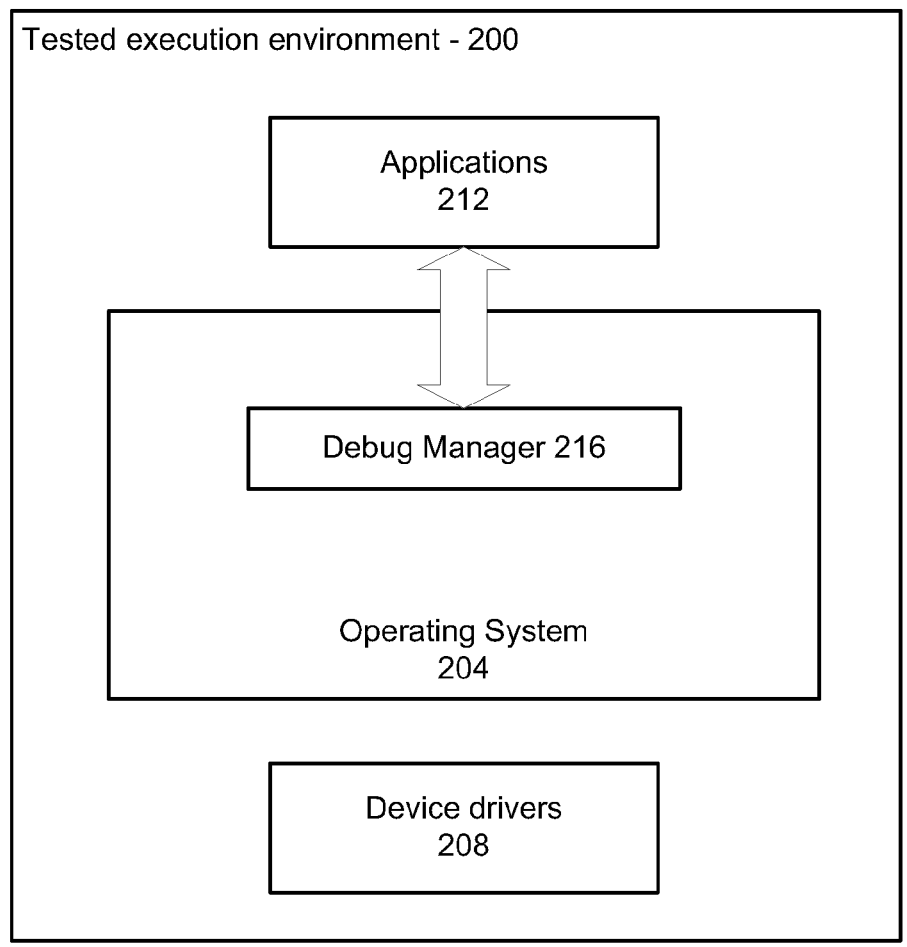
FIG. 2 is a tested execution environment in accordance with various embodiments of the present invention.

In operation, the processing block 104 may access a plurality of processes that reside in the memory block 108. Execution of the accessed processes by the processing block 104 may result in a tested execution environment (hereinafter "tested environment") 200 shown in FIG. 2 in accordance with an embodiment.

The executing processes of the tested environment 200 may include both service processes and application processes. A service process may include, e.g., a kernel of an operating system 204, operating system device drivers 208, etc. An application process may include various user applications, e.g., applications 212.

Figure 3:
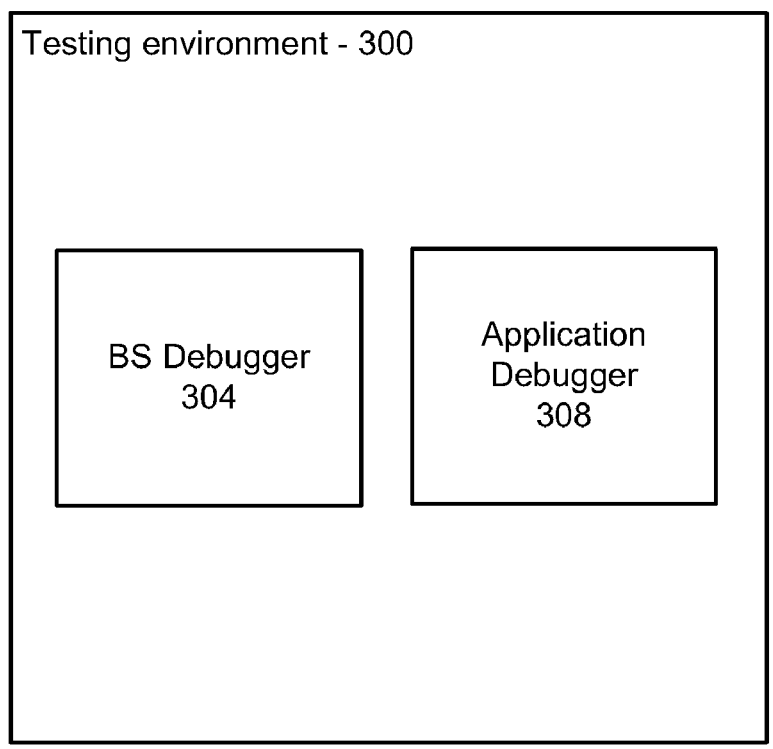
FIG. 3 is a testing execution environment in accordance with various embodiments of the present invention.

The tested environment 200 may be accessed by an external testing execution environment (hereinafter "testing environment") 300, which is shown in FIG. 3 in accordance with an embodiment of the present invention. The testing environment 300 may include a boundary scan (BS) debugger 304, e.g., a JTAG debugger, and an application debugger 308. The testing environment 300 may be implemented by a testing platform having interfaces to complement the interfaces of the SOC 100.

The application debugger 308 may be operatively coupled to the tested environment 200 through the interface 116 of the SOC 100. The application debugger 308 may communicate with the SOC 100 using any of a variety of communication protocols, e.g., universal serial bus (USB), transmission control protocol/Internet protocol (TCP/IP), serial, parallel, FireWire, etc. In other embodiments, the application debugger 308 may exist in the tested environment 200. In other embodiments, the application debugger 308 may exist on the SOC 100 for native debugging in order to debug an application on the SOC 100 without any external interface requirements.

The BS debugger 304 may be operatively coupled to the tested environment 200 through the BSI 112 of the SOC 100.

The BSI 112 may, in addition to providing a boundary interface to the BS debugger 304, provide a debug event monitor (DEM) 120. The DEM 120 may include circuitry designed to provide monitoring and event trigger functionalities that enable concurrent operation of the BS debugger 304 and the application debugger 308.

Figure 4:
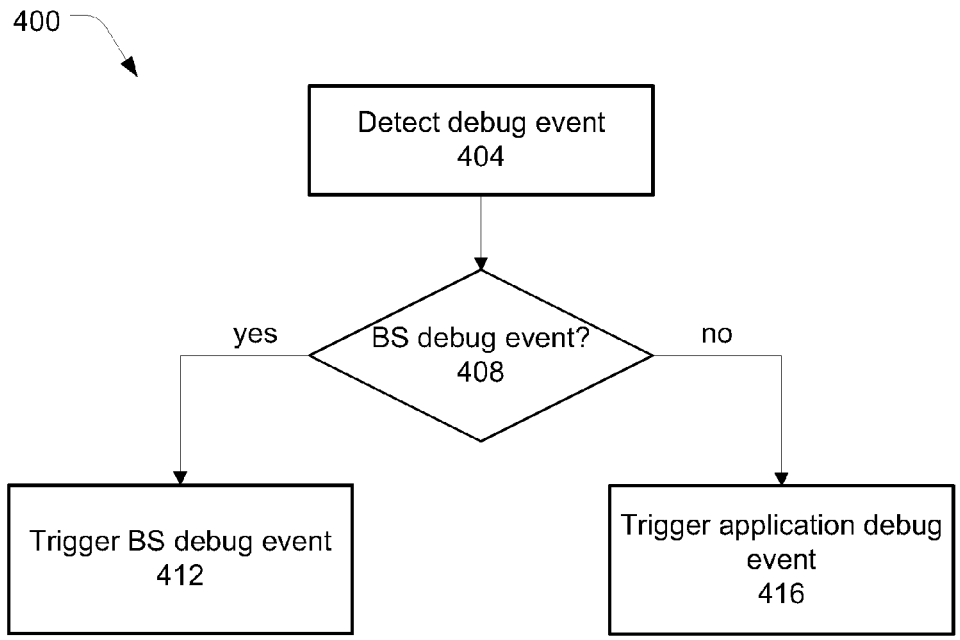
FIG. 4 is a flowchart depicting a debug event triggering operation in accordance with various embodiments of the present invention.

FIG. 4 is a flowchart 400 depicting an operation of the DEM 120 in accordance with various embodiments of the present invention. During a concurrent debugging operation a debug event may occur in one of the processes and be detected by the DEM 120 at block 404. A debug event includes, for example, breakpoints, hardware breakpoints, hardware watchpoints (also known as data breakpoints), and other events within the SOC 100 such as, for example, interrupts, data abort, illegal instruction, etc. At block 408, the DEM 120 may determine whether the debug event is a BS debug event. If it is determined that the debug event is a BS debug event, the DEM 120 may trigger a BS debug event at block 412 and pass the event to the BS debugger. If it is determined that the debug event is not a BS debug event, the DEM 120 may trigger an application debug event at block 412 and the event may be passed to the debug manager 216.

It may be that the passing of an event may be a passive operation. For example, if the DEM 120 triggers an application debug event in block 412 it may simply allow the debug manager 216 to pick up the debug event on its own.

The DEM 120 may determine whether the debug event is a BS debug event by examination of a characteristic associated with the debug event. In one embodiment, the characteristic may be related to a memory address of instructions that are executing when the debug event occurs. If the memory address is within a range of memory addresses associated with a service process to be debugged by the BS debugger 304, then the DEM 120 may determine that the debug event is a BS debug event. This determination may be done by evaluating the results of an operation that includes the executing memory address and a bitmask stored in a register of the DEM 120.

In another embodiment, the characteristic associated with the debug event may be an execution mode that the processing block 104 is in when the debug event occurs. The processing block 104 may be in a user mode, a system mode, an interrupt mode, a debug exception mode, etc. It may be that if the processing block 104 is in one or more of these modes when the debug event occurs, the debug event will be (or will not be) a BS debug event. For example, in architectures having different code regions and modes, a user may set a hardware watch point (which will be triggered in case of a memory access) to stop if a certain memory region is accessed. The memory may be accessed either from the user application or the kernel. Depending on the type of the watch point, the user does not want to debug the access from the user application, but rather from the kernel or device driver. Some architectures do support the same code region running in different modes and thus, the same code may be executed from privileged and "normal" modes. However, the user may only want to debug the code if executed in a certain mode.

Having the DEM 120 make the determination of whether a debug event is a BS debug event (and only forwarding the event to the BS debugger 304 if it is a BS debug event) may prevent the BS debugger 304 from unintentionally intercepting an application debug event and stopping the OS and the application debugger 308.

Furthermore, having the DEM 120 make this determination may be more efficient than passing the debug event to the BS debugger 304 and having the BS debugger 304 decide whether debug event is a BS debug event. It may be that having the BS debugger 304 decide whether the debug event is a BS debug event may provide significant delays to a debugging operation.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present invention. This application is intended to cover any adaptations or variations of the embodiment discussed herein. Therefore, it is manifested and intended that the invention be limited only by the claims and the equivalents thereof.

What is claimed is:

1. An apparatus, comprising:
  a processing block configured to execute a plurality of processes; and
  a boundary scan interface having a debug event monitor, wherein the debug event monitor is configured (i) to detect a debug event within a first process of the plurality of processes, (ii) to determine whether the debug event is a boundary scan debug event or an application debug event, and (iii) to trigger either (a) the boundary scan debug event or (b) the application debug event based at least in part on the determining;
  wherein the debug event monitor is further configured to determine whether the debug event is the boundary scan debug event or the application debug event based on an execution mode of the processing block when the debug event is detected.

2. The apparatus of claim 1, wherein the debug event monitor is further configured to determine whether the debug event is the boundary scan debug event or the application debug event based on a memory address of instructions executing when the debug event is detected.

3. The apparatus of claim 2, wherein the debug event monitor includes a bitmask and is configured to determine whether the debug event is the boundary scan debug event or the application debug event based on the bitmask and the memory address.

4. The apparatus of claim 1, wherein the apparatus is a system-on-a-chip.

5. The apparatus of claim 1, wherein the plurality of processes include a service process and an application process.

6. The apparatus of claim 5, wherein the debug event monitor determines that the first process is an application process and triggers the application debug event.

7. The apparatus of claim 6, wherein an application debugger of the plurality of processes is configured to receive the application debug event and debug the application process.

8. The apparatus of claim 5, wherein the debug event monitor determines that the first process is a service process and triggers the boundary scan debug event.

9. The apparatus of claim 1, wherein the debug event monitor comprises debug event monitor circuitry.

10. The apparatus of claim 1, wherein the boundary scan interface comprises a Joint Test Action Group (JTAG) interface.

11. A method comprising:
  executing a plurality of processes;
  detecting a debug event within a first process of the plurality of processes;
  determining whether the debug event is a boundary scan debug event or an application debug event based on a memory address associated with the first process;
  triggering either (i) the boundary scan debug event or (ii) the application debug event based at least in part on the determining; and
  determining whether a second debug event is a boundary scan event or an application scan event based on an execution mode of the processing block executing the first process when the second debug event is detected.

12. The method of claim 11, wherein said determining comprises determining whether the debug event is a boundary scan debug event or an application debug event based on a memory address of instructions executing when the debug event is detected.

13. The method of claim 12, wherein said determining whether the debug event is a boundary scan debug event or an application debug event further comprises determining the memory address of instructions executing when the debug event is detected based on a bitmask.

14. The method of claim 11, further comprising:
  determining that the first process is a service process; and
  triggering the boundary scan debug event.

15. The method of claim 14, further comprising passing the boundary scan debug event to an external boundary scan debugger.

16. The method of claim 11, further comprising:
  determining that the first process is an application process; and
  triggering the application debug event.

17. A system comprising:
  a tested platform having a processing block configured to execute a plurality of processes, and a boundary scan interface having a debug event monitor configured (i) to detect a debug event within a first process of the plurality of processes, (ii) to determine whether the debug event is a boundary scan debug event or an application debug event based on (a) a memory address associated with the first process and (b) an execution mode of the processing block when the debug event is detected, and (iii) to trigger either (a) the boundary scan debug event or (b) the application debug event based at least in part on the determination; and a testing platform having a boundary scan debugger operatively coupled to the plurality of processes through the boundary scan interface.

18. The system of claim 17, wherein the debug event monitor is configured to trigger the boundary scan debug event and pass the boundary scan debug event to the boundary scan debugger.

19. The system of claim 17, wherein the boundary scan debugger comprises a Joint Test Action Group (JTAG) debugger.

20. The system of claim 17, wherein the plurality of processes include a service process and an application process.

* * * * *